United States Patent [19]
Holder, Jr.

[11] Patent Number: 5,986,969
[45] Date of Patent: Nov. 16, 1999

[54] POWER SAVINGS FOR MEMORY ARRAYS

[75] Inventor: Clinton Hays Holder, Jr., Slatington, Pa.

[73] Assignee: Lucent Technologies, Inc., Murray Hill, N.J.

[21] Appl. No.: 09/217,613

[22] Filed: Dec. 22, 1998

Related U.S. Application Data

[63] Continuation of application No. 08/900,773, Jul. 25, 1997.

[51] Int. Cl.⁶ ....................................................... G11C 8/00
[52] U.S. Cl. ................ 365/233; 365/230.03; 365/230.06
[58] Field of Search ............................... 365/233, 230.03, 365/230.06

[56] References Cited

U.S. PATENT DOCUMENTS

| | | | |
|---|---|---|---|
| 5,477,491 | 12/1995 | Shirai | 365/233 |
| 5,666,322 | 9/1997 | Conkle | 365/233 |
| 5,708,622 | 1/1998 | Ohtani et al. | 365/233 |
| 5,805,514 | 9/1998 | Iwakiri | 365/233 |
| 5,808,958 | 9/1998 | Vogley et al. | 365/233 |
| 5,872,742 | 2/1999 | Kengeri et al. | 365/233 |

*Primary Examiner*—Trong Phan

[57] ABSTRACT

Power usage of an integrated circuit including an embedded memory array is reduced significantly by preventing a clock signal from clocking unaccessed memory blocks in the embedded memory array while allowing the clock signal to clock the currently accessed memory block. In an exemplary embodiment, the clock signal is gated with individual memory block enable signals such that the clock signal clocks only the currently enabled or accessed memory block. Only one memory block or a limited number of memory blocks out of an array of memory blocks on a data bus is clocked or operated at any one time. In another embodiment, a delay circuit delays the removal of the clock signal to the accessed memory block until a period of time after the enable signal to the memory block is removed. Thus, the accessed or enabled memory block is allowed to clock internally substantially only during a time corresponding to when that memory block is enabled or accessed.

15 Claims, 6 Drawing Sheets

POWER SAVINGS FOR MEMORY ARRAYS

This case is a continuation of U.S. application Ser. No. 08/900,773, filed Jul. 25, 1997, entitled "Power Savings For Memory Arrays", the entirety of which is explicitly incorporated herein by reference.

BACKGROUND OF THE INVENTION

1. Field of the Invention

This invention relates to a method and apparatus for reducing power usage of embedded memory in a semiconductor device. More particularly, it relates to the reduction or elimination of power drain by unaccessed or inactive embedded SRAM memory blocks or other clocked or synchronized embedded memory components.

2. Background of Related Art

In general, it is important to reduce power usage of integrated circuits where possible, particularly in the case of sophisticated power-hungry integrated circuits which include embedded memory, e.g., static random access memory (SRAM). Generally, integrated circuits operate less efficiently as their temperature increases. A reduction in power usage provides less heat dissipation by the underlying integrated circuit. Increased heat dissipation requires increased heat sinking, fan capacity or other structure to cool the integrated circuit, enlarging the size and reducing the speed and performance of the product.

FIG. 5 shows pertinent portions of a conventional integrated circuit including embedded synchronized memory, e.g., a DSP 320 such as the DSP1620 commercially available from LUCENT TECHNOLOGIES.

A DSP core 300 is embedded in the DSP 320, as are other DSP logic 302 and SRAM memory array 310. The SRAM memory array 310 comprises a plurality of individual SRAM memory blocks 312. The DSP core 300 communicates with the SRAM memory blocks 312 through address bus 304, data bus (or busses if the SRAM memory blocks 312 are dual port SRAM) 306, and control lines 308.

Conventional communication lines between DSP core 300 and SRAM memory blocks 312 are shown in more detail in FIG. 6. A clock line 360 and a read/write line 362 communicate in common with all SRAM memory blocks 312a–312d. Individually decoded enable lines 350, 352, 354, 356 separately enable each of the individual SRAM memory blocks 312a–312d.

FIG. 7 shows the clock signal from the DSP core 300 input directly into SRAM memory block 312a through a buffer formed by a serial connection of two inverters 360, 362.

In the example of a digital signal processor (DSP), embedded SRAM typically operates faster than external SRAM because it allows a DSP to operate without wait states which might otherwise be required when accessing external SRAM. However, on-chip embedded, synchronized SRAM comes at the price of increased power usage by the DSP.

One conventional solution to the increased power usage by embedded SRAMs is to remove the common clock signal simultaneously from all SRAM memory blocks when the SRAM memory array is not being accessed. However, this solution causes all SRAM memory to be placed in an inactive state. To subsequently access any individual SRAM memory block in the SRAM array, the clock must be reapplied to the entire SRAM array, thus activating all embedded SRAM memory blocks.

Thus, conventional embedded SRAM array structures require common clocking which activates all SRAM memory blocks together, causing significant power usage, increased heat dissipation and shorter battery life. As a result, a design balance must conventionally be made as between the amount of on-chip embedded SRAM and an overall minimization of power usage by the DSP.

SUMMARY OF THE INVENTION

According to the principles of one aspect of the present invention, an integrated circuit comprises a plurality of embedded memory units, and control means for enabling and controlling each of the plurality of embedded memory units. A processor is adapted to provide a clock signal to at least one of the plurality of embedded memory units approximately only when a respective at least one of the plurality of embedded memory units is enabled by the control means.

A method of reducing power usage of embedded memory In accordance with another aspect of the present invention comprises embedding a processing agent in an integrated circuit. A plurality of memory blocks are embedded in the integrated circuit, each of the plurality of memory blocks having an enabled state and a non-enabled state. At least one of the plurality of memory blocks is separately prevented from clocking internally when another of the plurality of memory blocks is in a respective enabled state.

In accordance with yet another aspect of the present invention, an integrated circuit including embedded memory components comprises a processor, and a plurality of memory components embedded in an integrated circuit with the processor. An address decoder is adapted to provide an enable signal to at least one of the plurality of memory components. A clock source is adapted to generate a clock signal for the at least one of the plurality of memory components. A control circuit is adapted to permit the clock signal to individually clock the at least one of the plurality of memory components in correspondence with the enable signal.

These and other objects, features and advantages of the present invention will become apparent to those skilled in the art from the following description with reference to the drawings.

BRIEF DESCRIPTION OF THE DRAWINGS

The invention will be described with reference to the drawings, in which.

DETAILED DESCRIPTION OF ILLUSTRATIVE EMBODIMENTS

Figure 1:
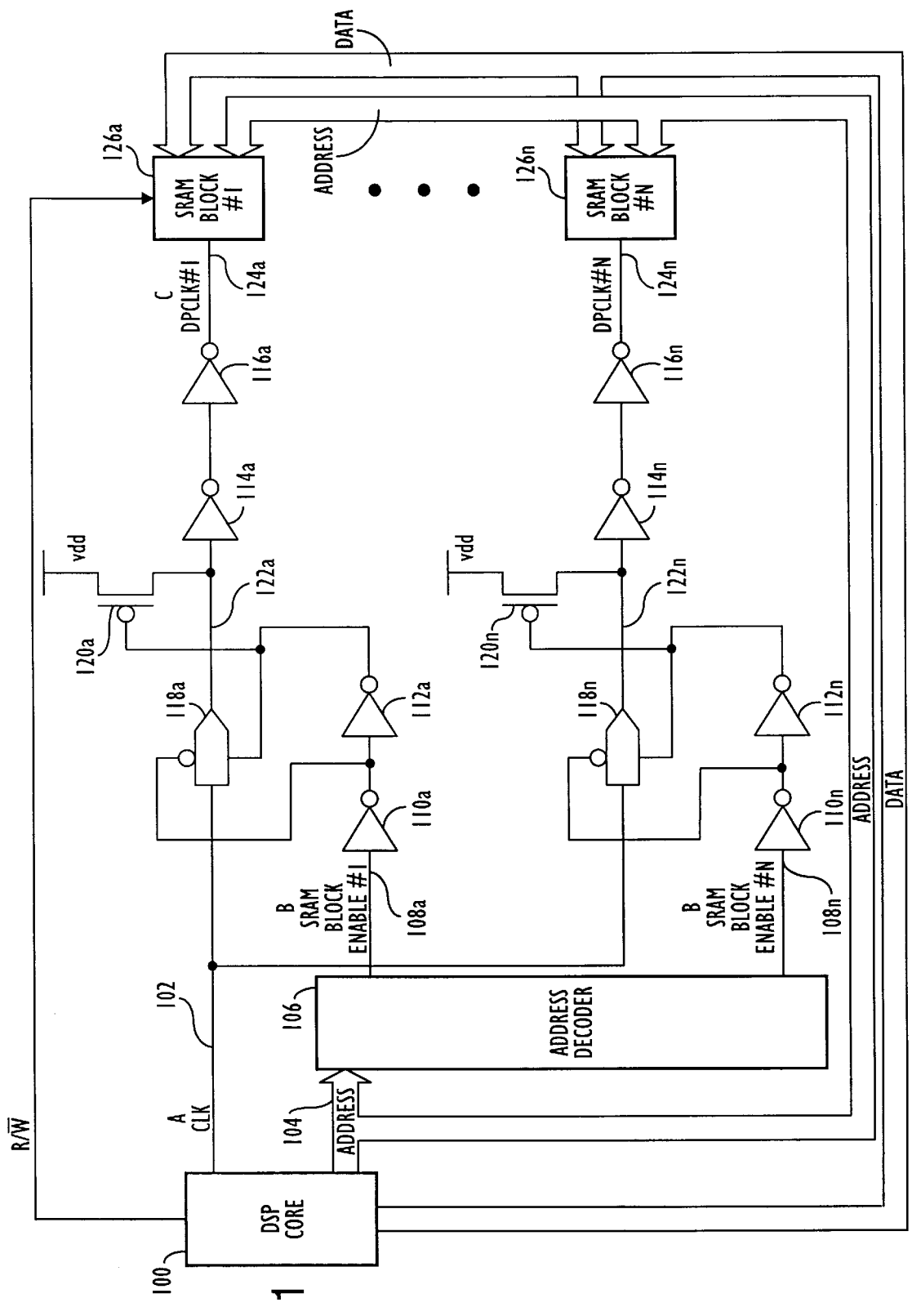
FIG. 1 shows a first exemplary embodiment of the present invention.

FIG. 1 shows a first exemplary embodiment of an integrated circuit with embedded SRAM according to the present invention. Although the exemplary embodiments relate to the savings of power usage by embedded memory in a DSP, the invention is equally applicable to the reduction of power usage in any embedded system including a plurality of clocked memory components.

Conventionally, in an integrated circuit, a common clock signal clocks all memory blocks in an embedded memory array simultaneously. The outputs of individual memory blocks are commonly tri-stated and draw increased power when accessed. However, it is found that even in the non-accessed state, a significant amount of power continues to be used by the array of embedded SRAM memory blocks.

According to the present invention, additional circuitry is embedded into the integrated circuit along with the embedded SRAM memory array to individually and separately control or permit the internal clocking of each SRAM memory block 126a–126n. In the first exemplary embodiment, additional embedded logic permits the common clock signal to be input to each individual SRAM memory block 126a–126n substantially only when the respective SRAM memory block 126a–126n is being accessed.

In this exemplary embodiment, the enable signals to each SRAM memory block 126a–126n are used to determine when each individual SRAM memory block 126a–126n is being accessed. However, other signals can be used to limit the clocking to individual SRAM memory blocks 126a–126n. For instance, the address signal can be used directly to indicate an access to individual SRAM memory blocks 126a–126n. Alternatively, a bank select signal can be used to indicate an access to one of a group of memory blocks in a bank, and thus provide some power savings by reducing the total number of memory blocks being permitted to clock internally.

In the first exemplary embodiment, DSP core 100 generates a buffered clock signal on clock line 102, and generates a buffered address signal on address bus 104. The clock signal generated by the DSP core 100 may be very slow, approaching DC levels, or as fast as hundreds of megahertz or more. The clock signal used in the exemplary embodiments is approximately 100 MHz. Although many other signals are generated and received by the DSP core 100, for simplicity only those pertinent to a description of the added structure and methods used to reduce power usage of an embedded memory array are described herein.

A pass transmission gate 118a–118n acts as a switch by either allowing or not allowing passage of the clock signal generated by DSP core 100 on clock line 102 to the individual SRAM memory blocks 126a–126n as clock signal DPCLK#1–DPCLK#N. The particular pass transmission gate 118a–118n used in the exemplary embodiments is in the open state only when presented with a logic HIGH on the non-inverting control gate and a logic LOW on the inverting control gate. Of course, any suitable electronic switch or pass through gate may be implemented with appropriate control signals.

When allowed to pass through pass transmission gate 118a–118n, the clock signal is buffered by two serially-connected inverters 114a–114n, 116a–116n, and thereafter presented to the respective SRAM memory block 126a–126n. Although a buffer is not absolutely necessary, it provides a level of isolation and signal strengthening between the DSP core 100 and the SRAM memory blocks 126a–126n. Each SRAM memory block 126a–126n has similar, corresponding logic between the clock line 102 and that SRAM memory block 126a–126n to prevent the clock signal from unnecessarily clocking that particular SRAM memory block.

The pass transmission gate 118a–118n provides a means for preventing passage of the clock signal and can be controlled by virtually any signal which is unique to the individual SRAM memory blocks 126a–126n or other division of the SRAM memory array, and which is consistent with the operational requirements of the SRAM. It would be possible to utilize signals other than a block enable signal which segment the SRAM, e.g., a bank select signal which selects a predetermined group of SRAM memory blocks. Grouping a number of SRAM memory blocks together for preventing simultaneous internal clocking in that group would reduce power usage of the SRAM memory array to some extent, but individual clocking of the SRAM memory blocks 126a–126n would provide the most advantageous power savings.

In the exemplary embodiments, an address decoder 106 decodes at least a portion of the address signals from the DSP core 100 to provide individual enable signals on enable lines 108a–108n in a way known by those of ordinary skill in the art. The individual enable signals are synchronized to the clock signal on clock line 102 either within the address decoder 106 or external to the address decoder 106. Each enable signal controls inverters 110a–110n and 112a–112n which drive the respective inverting and non-inverting control gates of pass transmission gate 118a–118n open or closed. For instance, when the logic state of the enable signal on enable line 108a is high, inverter 110a provides a LOW logic state to the inverted control gate of pass transmission gate 118a, and a second inverter 112a inverts the enable signal again to provide a HIGH logic state to the non-inverted control gate of pass transmission gate 118a, thus controlling the pass transmission gate 118a to an open or pass-through state.

When in the closed state, pass transmission gate 118a–118n presents a high impedance output to the input of inverter 114a–114n. To prevent the input to inverter 114a–114n from floating when the pass transmission gate 118a–118n is closed, a PMOS field effect transistor (PFET) 120a–120n provides a pull-up to the voltage level Vdd for the input of inverter 114a–114n and thus maintains the input to inverter 114a in a logic HIGH state.

The memory array shown may be single port or dual port RAM. Alternatively, the memory array may instead be an array of dynamic random access memory (DRAM) or read only memory (ROM) if implemented with internal clocking.

Figure 2:
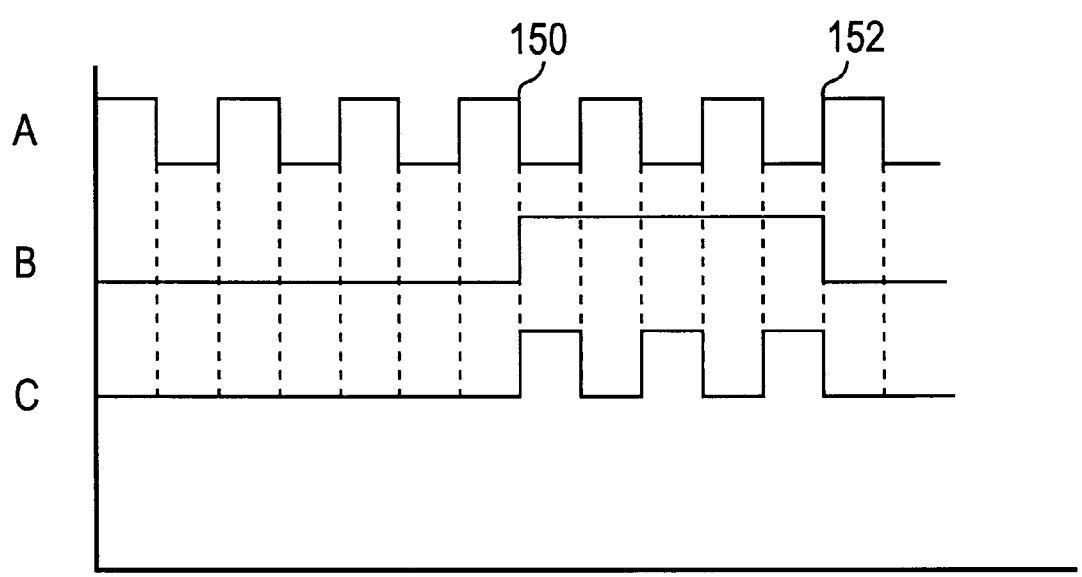
FIG. 2 is a timing diagram of the first exemplary embodiment shown in FIG. 1.

FIG. 2 shows the timing of the circuit shown in FIG. 1. Waveform A shows the clock signal on clock line 102; waveform B shows the enable signal on enable line 108a; and waveform C shows the clock signal on line 124a input to the individual SRAM memory block 126a. Waveform C shows that SRAM memory block 126a is presented with a clock signal on line 124a and thus is allowed to clock internally only when the enable signal on enable line 108a is active, i.e., from point 150 to point 152.

The power savings achieved by operating or clocking only one or at most a limited number of SRAM memory blocks in an SRAM array is significant. For instance, for a conventional SRAM array comprising thirty-two commonly-clocked SRAM memory blocks as in the DSP1620 available from LUCENT TECHNOLOGIES, using a 3V power supply and operating at 100 MHz, the total power used when clocking all SRAM memory blocks 126a–126n together can be calculated as approximately:

$$CV^2fN = power$$

$$(4\,pf)(3V)^2(100\text{ MHz})(32\text{blocks}) = 115\text{ mW}$$

Thus, in a two data bus system as in the exemplary DSP1620, up to:

$$115\text{ mW} - (3.6\text{ mW} \times 2) = 107.8\text{ mW}$$

can be conserved by allowing internal clocking of only the SRAM memory block being accessed on each data bus.

The first exemplary embodiment provides an embedded array of SRAM in which only one SRAM memory block on a bus at a time is clocked internally, thus effectively putting unaccessed SRAM memory blocks to sleep for maximum power savings. In some integrated circuits it may be desirable to provide a clock signal to the respective SRAM memory blocks not only during the time that the enable signal is active but also for some time after the enable signal goes inactive, i.e., beyond point 152 shown in FIG. 2, to allow for appropriate operation of the SRAM memory.

Figure 3:
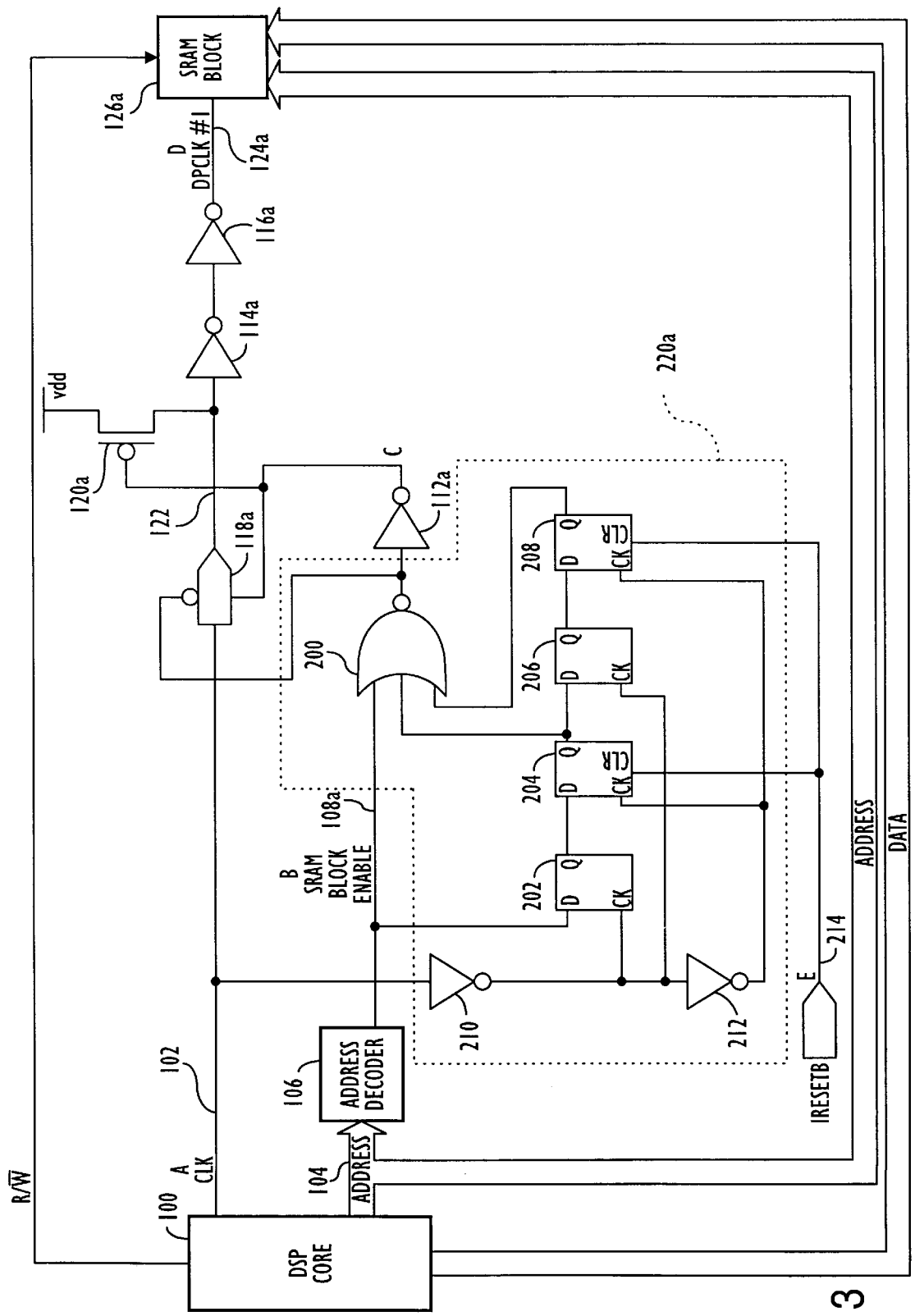
FIG. 3 shows a second exemplary embodiment of the present invention.

FIG. 3 is a second exemplary embodiment which allows the clock signal to pass through pass transmission gate 118a–118n for a delayed period of time beyond the point at which the enable signal goes inactive. The second exemplary embodiment is similar to the first exemplary embodiment but for the inclusion of delay circuit 220a. The DSP core 100, address decoder 106, pass transmission gate 118a–118n, PFET 120a–120n, inverters 114a–114n, 116a–116n, and other elements having the same reference numbers as those shown in FIG. 1 are the same as described with respect to the first exemplary embodiment. Delay circuit 220a delays the removal of the clock signal on line 124a from the individual SRAM memory block 126a. A similar delay circuit 220b–220n is implemented for each SRAM memory block 126a–126n.

A three-input NOR gate 200 is inserted between the enable signal on enable line 108a and the inverted and non-inverting control gates to the pass transmission gate 118a. If any of three signals corresponding to the three inputs to the NOR gate 200 are active, then the pass transmission gate 118a is retained in the open or pass through state. Otherwise, the pass transmission gate 118a reverts to the closed state.

The first signal which, when active, retains the pass transmission gate 118a in an open state is the enable signal on enable line 108a. As long as the enable signal is active, the pass transmission gate 118a will be retained in an open state.

The second signal driving the pass transmission gate 118a into the open state when active is the output of a delay circuit. Virtually any digital delay can be used, but should preferably be synchronized with the clock signal on clock line 102.

In the exemplary embodiment, a delay circuit is formed by a serial connection of four D-type flip-flops 202, 204, 206, 208. A D-type flip-flop is a digital logic device that stores the status of its "D" input whenever its clock input makes a certain transition, i.e., LOW to HIGH or HIGH to LOW. The "Q" output shows the currently stored or latched value of the "D" input. Clocked latches of other types can be implemented instead of D-type flip-flops, as can virtually any delay circuit.

The first D-type flip-flop or latch 202 latches the enable signal on enable line 108a upon an upward transition of the clock signal on clock line 102, which is inverted by inverter 210 before being input to the first latch 202. Then, the second latch 204 latches the "Q" output of the first latch 202 on the next downward transition of the clock signal on the clock line 102, twice inverted by the serial combination of inverters 210 and 212. The "Q" or non-inverted output of the second latch 204 provides a full clock cycle delay which is synchronized to the clock signal on clock line 102, and is input to the NOR gate 200 as the second signal which, when active, retains the pass transmission gate 118a in an open state.

The "Q" output of the second latch 204 is input as a third input to NOR gate 200 and thus as a third signal driving the pass transmission gate 118a. The third latch 206 latches the "Q" output of the second latch 204 on upward transitions of the clock signal on clock line 102, and the fourth latch 208 latches the "Q" output of the third latch 206 on downward transitions of the clock signal. Thus, latches 202–208 provide a two-clock-cycle delay after deactivation of the enable signal on the enable line 108a before the pass transmission gate 118a is turned OFF. Latches 202–208 also ensure that the clock signal will be applied to the respective SRAM memory blocks for at least two full clock cycles.

Latches 202–208 may be reset at power-up, by an interrupt reset, or by any other signal which ensures a reliable start-up condition. Of course, more or fewer latches may be implemented in the delay circuit 220a to provide the desired amount of clocking of SRAM memory blocks necessary to ensure reliable storage and retrieval of data from the SRAM memory array.

Figure 4:
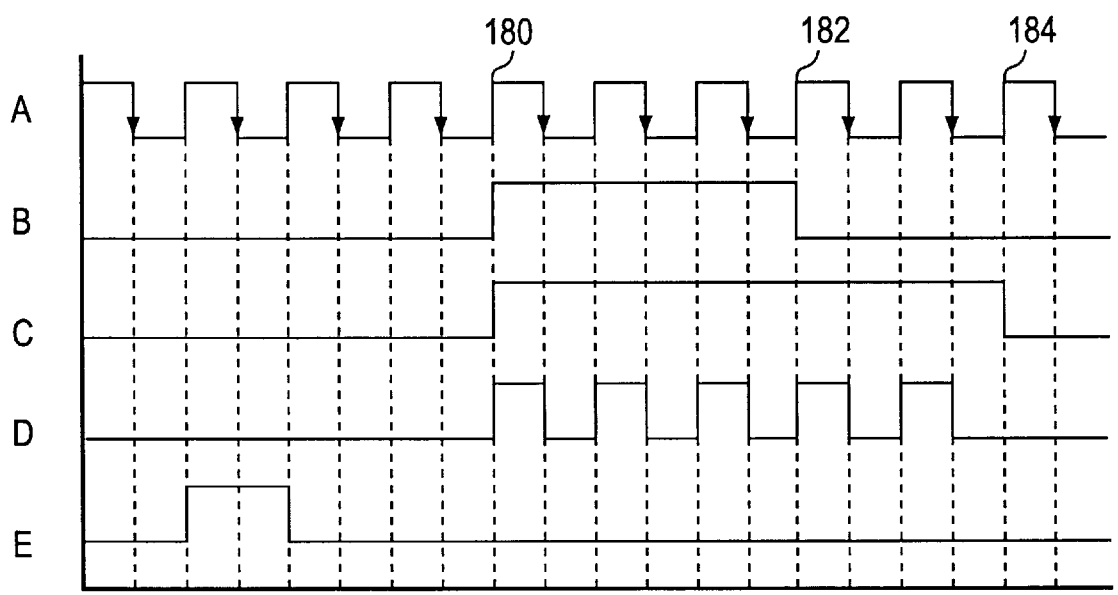
FIG. 4 is a timing diagram of the second exemplary embodiment shown in FIG. 3.
Figure 5:
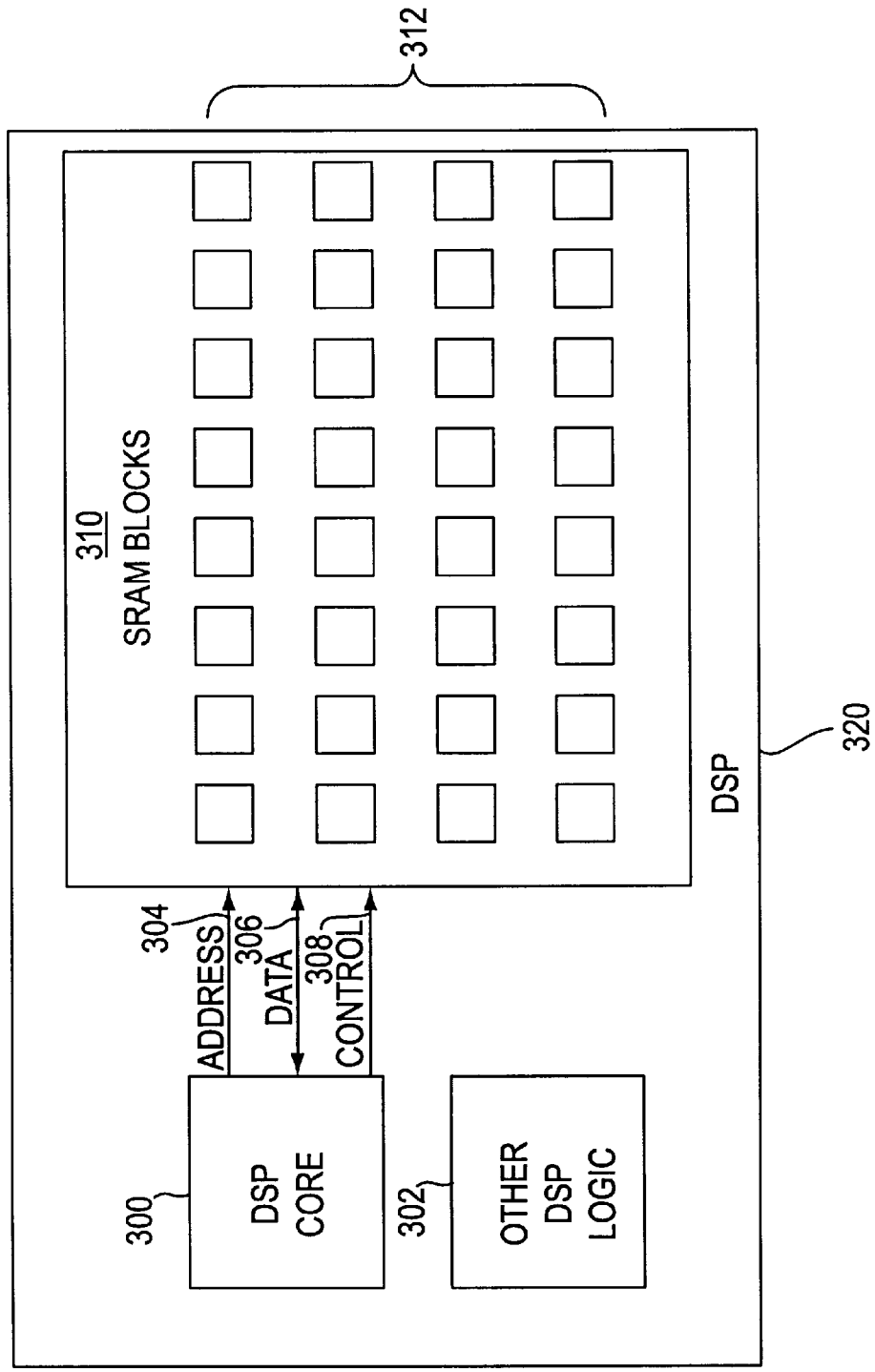
FIG. 5 is a simplified block diagram of a conventional digital signal processor including embedded SRAM.
Figure 6:
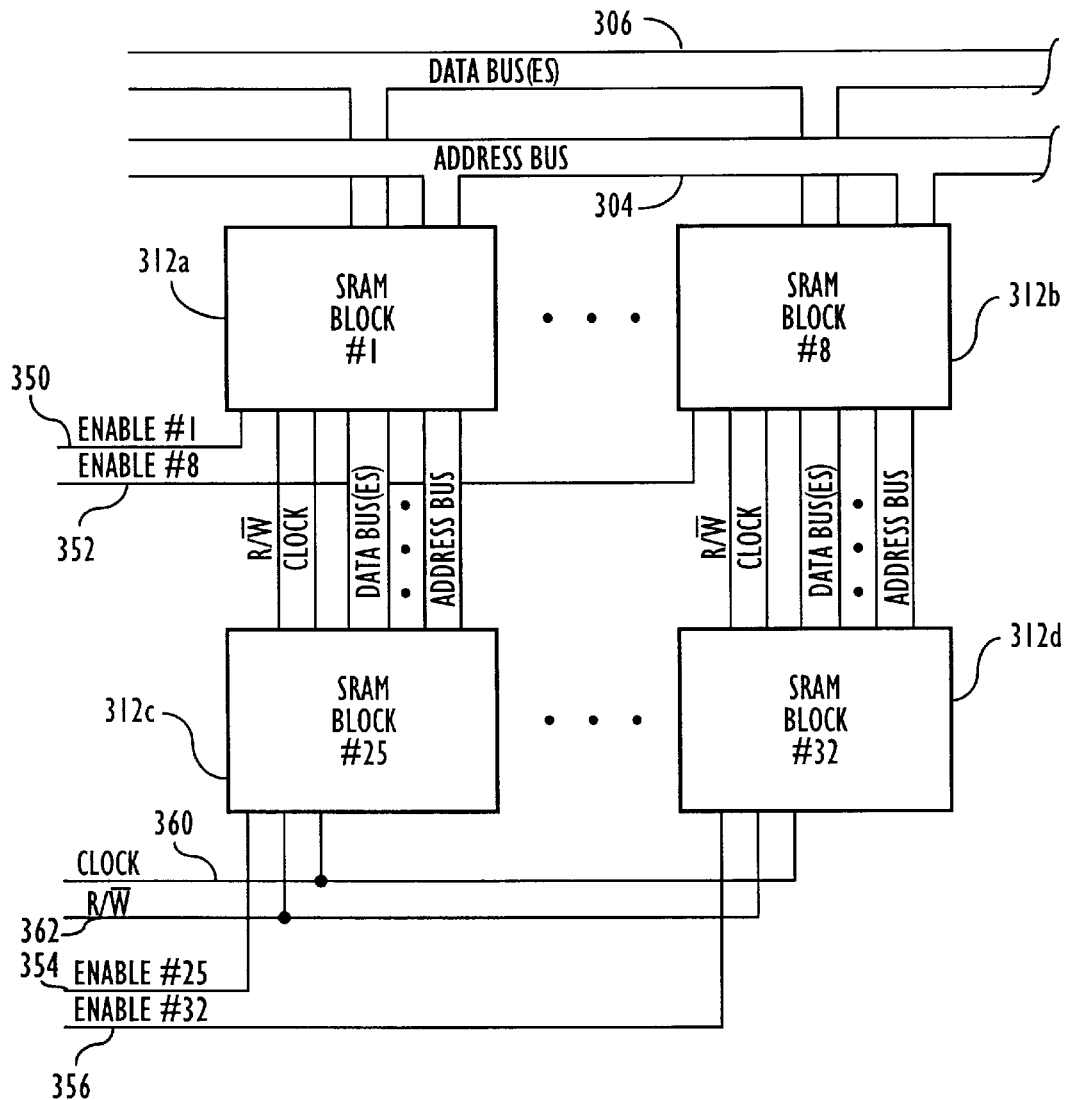
FIG. 6 is a more detailed block diagram showing in more detail the input and outputs of individual embedded SRAM memory blocks of a conventional DSP shown in FIG. 5.
Figure 7:
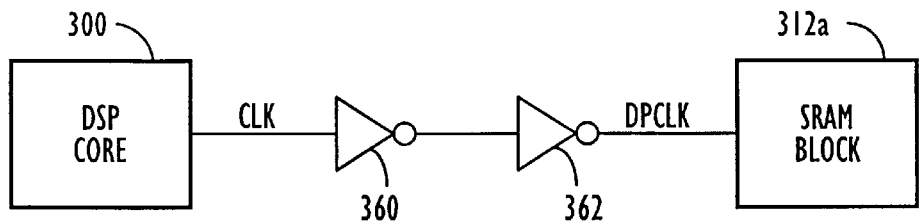
FIG. 7 shows conventional buffered clocking of individual embedded SRAM memory blocks shown in FIG. 5.

FIG. 4 is a timing diagram of the second exemplary embodiment shown in FIG. 3. Waveform A shows the clock signal on clock line 102. Waveform B shows the enable signal on enable line 108a. Waveform C shows the activation of the non-inverting control gate to the pass transmission gate 118a driving the same into an open, state. Waveform D shows the clocking of SRAM memory block 126a, which is permitted only between points 180 and 184. Waveform E depicts the reset signal to latches 204 and 208 on reset line 214. The reset signal can also be provided to the clear inputs of latches 202 and 206.

In operation, delay circuit 220a extends the length of time during which the respective SRAM memory block 126a is permitted to clock internally beyond the point 182 at which the enable signal on enable line 108a is deactivated, but does not change the point 180 at which the enable signal goes active, as shown in waveform C of FIG. 4. The amount of delay provided by delay circuit 220a may be increased or decreased as necessary based on the individual requirements of the SRAM memory blocks 126a–126n.

While the invention has been described with reference to the exemplary preferred embodiments thereof, those skilled in the art will be able to make various modifications to the invention without departing from the true spirit and scope of the invention as defined by the claims below. For instance, the present invention has been described with reference to exemplary embodiments relating to a DSP. However, the invention is equally applicable to all integrated circuits containing embedded memory arrays. Moreover, the particular logic used and signal levels may be different from those described herein without departing from the spirit and scope of the invention.

I claim:

1. A integrated circuit comprising:
   a plurality of embedded memory units;
   control means for enabling and controlling each of said plurality of embedded memory units; and
   a processor adapted to provide a clock signal to at least one of said plurality of embedded memory units approximately only when a respective at least one of said plurality of embedded memory units is enabled by said control means.

2. The integrated circuit according to claim 1, wherein: said processor is a digital signal processor.

3. The integrated circuit according to claim 1, further comprising:

an address decoder;

an address signal;

a data signal; and a read/write signal.

4. The integrated circuit according to claim 1, wherein: said plurality of memory units are an array of static random access memory.

5. The integrated circuit according to claim 1, wherein: said clock signal is applied to said at least one of said plurality of embedded memory units for a period of time after said control means enables said at least one of said plurality of embedded memory units.

6. A method of reducing power usage of embedded memory, comprising:

embedding a processing agent in an integrated circuit;

embedding a plurality of memory blocks in said integrated circuit, each of said plurality of memory blocks having an enabled state and a non-enabled state; and separately preventing at least one of said plurality of memory blocks from clocking internally when another of said plurality of memory blocks is in a respective enabled state.

7. The method of reducing power usage of embedded memory according to claim 6, further comprising:

allowing at most only two of said plurality of memory blocks to clock internally at any one time.

8. The method of reducing power usage of embedded memory according to claim 7, wherein:

each of said at most only two of said plurality of memory blocks corresponds to a separate data bus.

9. An integrated circuit including embedded memory components, comprising:

a processor;

a plurality of memory components embedded in an integrated circuit with said processor;

an address decoder adapted to provide an enable signal to at least one of said plurality of memory components;

a clock source adapted to generate a clock signal for said at least one of said plurality of memory components; and a control circuit adapted to permit said clock signal to individually clock said at least one of said plurality of memory components in correspondence with said enable signal.

10. The integrated circuit including embedded memory according to claim 9, wherein said processor comprises:

a processor core;

an address bus adapted to input an address signal to each of said plurality of memory components; and a data bus adapted to output data signals to each of said plurality of memory components.

11. The integrated circuit including embedded memory according to claim 10, wherein said processor further comprises:

a read/write line adapted to control access direction of said plurality of memory components.

12. The integrated circuit including embedded memory according to claim 9, wherein said control circuit comprises:

a pass transmission gate.

13. The integrated circuit including embedded memory according to claim 9, wherein:

said plurality of embedded memory components are random access memory components.

14. The integrated circuit including embedded memory according to claim 13, wherein:

said plurality of embedded memory components are static random access memory components.

15. The integrated circuit including embedded memory according to claim 9, wherein:

said control circuit is adapted to permit said clock signal to individually clock said at least one of said plurality of memory components for a period of time after said enable signal is removed from said at least one of said plurality of memory components.

* * * * *